United States Patent
Kondo

(10) Patent No.: US 8,390,385 B2
(45) Date of Patent: Mar. 5, 2013

(54) OSCILLATOR CIRCUIT, OSCILLATOR CIRCUIT GROUP, ELECTRONIC APPARATUS, AND LAYOUT METHOD FOR OSCILLATION CIRCUIT GROUP

(75) Inventor: Takayuki Kondo, Chino (JP)

(73) Assignee: Seiko Epson Corporation, Tokyo (JP)

( * ) Notice: Subject to any disclaimer, the term of this patent is extended or adjusted under 35 U.S.C. 154(b) by 57 days.

(21) Appl. No.: 12/769,253

(22) Filed: Apr. 28, 2010

(65) Prior Publication Data

US 2010/0277247 A1 Nov. 4, 2010

(30) Foreign Application Priority Data

May 1, 2009 (JP) ................................. 2009-112189

(51) Int. Cl.
*H03B 5/32* (2006.01)
*G01N 29/14* (2006.01)

(52) U.S. Cl. ..... 331/46; 331/158; 331/108 D; 73/23.34; 73/31.05; 73/579

(58) Field of Classification Search ............... 331/46, 331/108 C, 108 D, 44, 116 R, 116 FE, 158; 73/23.3, 23.34, 24.01, 24.06, 31.05, 31.06, 73/579, 590; 310/341, 342, 365, 366
See application file for complete search history.

(56) References Cited

U.S. PATENT DOCUMENTS

| 5,447,869 A | 9/1995 | Okahata |
| 7,159,463 B2 * | 1/2007 | Dayagi et al. ................. 73/579 |

FOREIGN PATENT DOCUMENTS

| JP | A-63-222248 | 9/1988 |
| JP | A-05-187986 | 7/1993 |
| JP | A-06-177702 | 6/1994 |
| JP | B2-08-012141 | 2/1996 |
| JP | A-2000-059169 | 2/2000 |
| JP | A-2009-222669 | 10/2009 |

OTHER PUBLICATIONS

Potyrailo et al., "Multifunctional sensor system for high-throughput primary, secondary, and tertiary screening of combinatorial materials", Jun. 2004, Review of Scientific Instruments, vol. 75, No. 6, pp. 2177-2186.*

* cited by examiner

*Primary Examiner* — Ryan Johnson
(74) *Attorney, Agent, or Firm* — Oliff & Berridge, PLC

(57) ABSTRACT

An oscillation circuit includes: a first oscillation circuit and a second oscillation circuit, wherein the first oscillation circuit includes a first input side electrode electrically connected to a first oscillator and a first output side electrode electrically connected to the first oscillator, and the second oscillation circuit includes a second input side electrode electrically connected to a second oscillator and a second output side electrode electrically connected to the second oscillator, wherein the distance between the first output side electrode and the second input side electrode is greater than the distance between the first input side electrode and the first output side electrode.

18 Claims, 5 Drawing Sheets

OSCILLATOR CIRCUIT, OSCILLATOR CIRCUIT GROUP, ELECTRONIC APPARATUS, AND LAYOUT METHOD FOR OSCILLATION CIRCUIT GROUP

The entire disclosure of Japanese Patent Application No. 2009-112189, filed May 1, 2009 is expressly incorporated by reference herein.

BACKGROUND

1. Technical Field

The present invention relates to oscillator circuits, oscillator circuit groups, electronic apparatuses, and layout methods for an oscillation circuit group.

2. Related Art

When certain molecules adhere to the surface of a crystal oscillator that is in a resonance state, the resonance frequency changes according to the adsorption amount (weight). A technology using such a phenomenon is called QCM (Quarts Crystal Microbalance), and used in sensors for detecting the presence or the amount of molecules. As one of the applications of QCM, an odor sensor is known. The odor sensor is equipped with multiple oscillation circuits including oscillators having adsorption films formed thereon which selectively adsorb specified molecules.

For example, Japanese Laid-open Patent Application SHO 63-222248 (Patent Document 1) describes a technology that uses an element having a crystal oscillator with electrodes and adsorption films formed thereon (FIG. 6 in Patent Document 1) for detecting the presence of odor substance saturated in the air atmosphere by means of a change in the frequency.

Also, Japanese Examined Patent Application Publication HEI 08-012141 (Patent Document 2) and Japanese Laid-open Patent Application HEI 05-187986 (Patent Document 3) describe technologies for specifying the kinds of odors by using a plurality of crystal oscillators.

In order to make an odor sensor with high accuracy having an odor identifying capability equivalent to that of a human being or a dog, it is considered that several hundred odor sensor units each made of a combination of an oscillator, an oscillation circuit and adsorption films may be required. Therefore, in the case of an odor sensor having such a high accuracy, several hundred odor sensor units may preferably be arranged in an array configuration.

However, when numerous odor sensor units are arranged in an array configuration, input/output wirings of the oscillation circuits need to be densely arranged, and the wire-to-wire distance becomes smaller, which would cause a problem of crosstalk among closely arranged wirings. In particular, crosstalk poses a problem in equipments that operate at high frequencies. QCM sensors use high frequency signals on the order of MHz in order to increase the sensitivity of the sensors. Therefore, it is required to suppress such crosstalk of high frequency signals. In order to suppress crosstalk among wirings, it is possible to use a method of setting a greater wire-to-wire distance or a method to prevent mutual interference by using a shielded wire such as a coaxial cable or the like. However, either of the methods would result in a greater circuit area and a larger wire harness of cables, which entails a problem of higher manufacturing cost, and hindrance to size-reduction.

SUMMARY

In accordance with an embodiment of the invention, there is provided an oscillation circuit that may be included in an odor sensor or the like which can suppress influences by crosstalk.

In accordance with an embodiment of the invention, an oscillation circuit includes a first oscillation circuit and a second oscillation circuit, wherein the first oscillation circuit includes a first input side electrode electrically connected to a first oscillator and a first output side electrode electrically connected to the first oscillator, and the second oscillation circuit includes a second input side electrode electrically connected to a second oscillator and a second output side electrode electrically connected to the second oscillator, wherein the distance between the first output side electrode and the second input side electrode is greater than the distance between the first input side electrode and the first output side electrode.

The oscillation circuit including the vibrator electrically connected through an electrode pair made of the input side electrode and the output side electrode is characterized in that a signal on the input side electrode is amplified, and outputted from the output side electrode. For this reason, the voltage amplitude of the signal on the input side electrode is relatively small, while the voltage amplitude of the signal on the output side electrode is larger. Also, it is characterized in that the signal on the input side electrode is a signal closer to a sine wave, while the signal on the output side electrode is a signal closer to a square wave.

In other words, as the signal on the input side electrode is a sine wave having a small signal amplitude, it is difficult to become a generation source of EMI (electromagnetic interference) noise. However, if noise enters the signal on the input side electrode, the noise is amplified due to the characteristic of the oscillation circuit of amplifying signals, and outputted from the output side electrode. In other words, the input side electrode would be difficult to become a noise generation source, but would likely be influenced by noise.

On the other hand, on the output side electrode, the voltage amplitude of the signal is large, and the signal is closer to a square wave signal that contains many high frequency components. Therefore, the output side electrode would likely become a noise generation source. However, the signal on the output side electrode is greater in voltage amplitude than the signal on the input side electrode, and therefore is difficult to be affected by noise. Also, the signal on the output side electrode does not have a characteristic of amplifying noise, like the signal on the input side electrode. In other words, it can be said that the output side electrode would likely become a noise generation source, but would be difficult to be affected by noise.

In view of the characteristics described above, in an oscillation circuit that includes oscillators, like the one according to the invention, it is understood that the electrodes are desirous to be arranged in a manner that the input side electrodes and the output side electrodes are not close to one another in order to reduce the influence of crosstalk.

In this respect, according to the structure of the invention described above, the input side electrode of one oscillation circuit and the output side electrode of another oscillation circuit do not come closer to each other more than necessary. Therefore, the influence by crosstalk on the input side electrode given by the output side electrode can be reduced.

Also, according to the structure described above, as the influence by crosstalk on the input side electrode given by the output side electrode can be reduced, an interference preventive structure with respect to the output side electrode and the input side electrode can be reduced or eliminated. By this, size-reduction of the oscillation circuit can be facilitated, and the cost can be reduced. This makes it also possible to achieve size-reduction and cost reduction of sensor systems and electronic apparatuses having the oscillation circuits mounted thereon.

Also, the distance between the first output side electrode and the second input side electrode may preferably be greater than the distance between the second input side electrode and the second output side electrode.

Further, the oscillation circuit may include a third oscillation circuit, wherein the third oscillation circuit has a third input side electrode electrically connected to a third oscillator and a third output side electrode electrically connected to the third oscillator, wherein a first direction is defined by a direction from the first input side electrode to the first output side electrode, the first input side electrode, the first output side electrode, the second input side electrode and the second output side electrode may preferably be aligned in the first direction; the first input side electrode and the third input side electrode may preferably be aligned in a second direction traversing the first direction; and the first output side electrode and the third output side electrode may preferably be aligned in the second direction.

According to the structure described above, the oscillation circuits can be effectively arranged in a small area, while making the best use of the advantages of the invention described above.

Also, the first input side electrode and the first output side electrode may preferably be provided in a first terminal arrangement region having a specified configuration, the first input side electrode may preferably be disposed near a first end of the first terminal arrangement region, the first output side electrode may preferably be disposed near a second end of the first terminal arrangement region opposing the first end, and other terminal arrangement regions are disposed adjacent to the first terminal arrangement region, wherein the terminal arrangement regions may preferably be disposed such that the first ends of the terminal arrangement regions where the input side electrodes are disposed are gathered together.

According to the structure described above, the input side electrodes are arranged so as to be gathered together, such that the influence by crosstalk that may be inflicted on the input side electrodes by the output side electrodes can be further reduced.

Furthermore, the terminal arrangement region has a square shape, and the input side electrode and the output side electrode may preferably be arranged to be located on a diagonal line of the terminal arrangement region.

According to the structure described above, the distance between the input side electrode and the output side electrode in the same oscillation circuit defines the longest distance in the terminal arrangement region, whereby the influence by noise between the input side electrode and the output side electrode disposed in the same oscillation circuit can be made smaller. Also, an interference prevention structure that may be needed for the input side electrode or the output side electrode can be reduced, or eliminated.

Also, it is preferred that one of the input side electrodes and the output side electrodes are arranged on a first circle, and the other of the input side electrodes and the output side electrodes are arranged on a second circle that has a greater radius than the first circle and is concentric with the first circle.

According to the structure described above, the oscillation circuits are arranged in a circular configuration such that the output side electrodes that are noise generation sources are disposed outside (or inside), such that the influence by noise that may be inflicted on the input side electrodes disposed inside (or outside) the circle can be made smaller. Also, when the oscillation circuits are used in a sensor, the oscillation circuits are arranged in a manner that the oscillators connected to the oscillation circuits are disposed with suitable gaps from one another. Accordingly, the oscillators would more readily contact medium to be measured, and therefore the sensitivity of the sensor can be made higher.

Also, an oscillation circuit group in accordance with an embodiment of the invention pertains to an oscillation circuit group including a plurality of oscillation circuits, each of the oscillation circuits including an oscillator connected through an electrode pair made of an input side electrode and an output side electrode, wherein the oscillation circuit group is laid out such that placement of the output side electrode in one of the oscillation circuits is prohibited and placement of the input side electrode is permitted in a predetermined range from the input side electrode of another of the oscillation circuits.

According to the composition described above, the influence of noise on the input side electrode of an oscillation circuit which may be caused by the output side electrode can be suppressed.

Also, the predetermined range may preferably be a range with a distance between the input side electrode and the output side electrode in each of the oscillation circuits being as a radius about the input side electrode as a center.

The oscillation circuit is in principle equipped with an input side electrode and an output side electrode, wherein the input side electrode is disposed at a distance by which it may not be affected by noise caused by crosstalk from the output side electrode in the same oscillation circuit. Therefore, if the distance between the input side electrode in one oscillation circuit and the output side electrode in another oscillation circuit is longer than the distance between the input side electrode and the output side electrode in the one oscillation circuit, the influence of noise that the input side electrode in the one oscillation circuit may receive from the output side electrode in the other oscillation circuit may be relatively small. Further, by avoiding an excessive prohibition with respect to the location of disposing the output side electrode in the other oscillation circuit, an increase in the circuit size can be prevented.

Furthermore, an electronic apparatus in accordance with an embodiment of the invention includes the oscillation circuit described above or the oscillation circuit group described above. As the electronic apparatus having the structure described above is equipped with the characteristics of the oscillation circuit or the oscillation circuit group in accordance with each of the embodiments of the invention described above, for example, the influence on the input side electrode by crosstalk caused by the output side electrode can be reduced.

Also, an oscillation circuit array in accordance with an embodiment of the invention pertains to an oscillation circuit array including a plurality of oscillation circuits, wherein each of the oscillation circuits includes an oscillator connected through an electrode pair made of an input side electrode and an output side electrode, wherein the input side electrodes in adjacent ones of the oscillation circuits are arranged adjacent to one another.

Moreover, a layout method for an oscillation circuit group in accordance with an embodiment of the invention pertains to a layout method for an oscillation circuit group including a plurality of oscillation circuits, wherein each of the oscillation circuits includes an oscillator connected through an electrode pair made of an input side electrode and an output side electrode, wherein the oscillation circuit group is laid out such that placement of the output side electrode in one of the oscillation circuits is prohibited and placement of the input side electrode is permitted in a predetermined range from the input side electrode of another of the oscillation circuits.

According to the method described above, the oscillation circuits can be laid out in a manner to suppress the influence on the input side electrode in an oscillation circuit that may be caused by noise from the output side electrode.

It is noted that the arrangement of the oscillation circuits in the oscillation circuit group described in the specification is not limited to a plane surface. In other words, the oscillation circuits in the specification may be disposed on a curved surface or a globular surface. It is noted that arrangement of the oscillation circuits on a plane may be advantageous because such arrangement is relatively easy. On the other hand, arrangement of the oscillation circuits on a curved surface or a globular surface has an advantage in that the oscillation circuits can be arranged in a smaller area, and the oscillation circuits can be arranged in a desired three-dimensional configuration.

Also, a mounting plane surface for crystal oscillators in the specification is one of the terminal arrangement regions. Also, the "electronic apparatus" in the specification includes any and all apparatuses equipped with an oscillation circuit, an oscillation circuit group or an oscillation circuit array described in the specification. Such apparatuses include sensors such as odor sensors, alcohol sensors, narcotic sensors and the like.

Also, any "○○ circuit (○○ may be any arbitrary words)" appearing in the present specification not only include an electrical circuit, but may also include a physical mean that achieves the function of the circuit or a functional mean that is realized by software. Also, the function of one section may be realized by two or more physical means or functional means, or the function of two or more sections may be realized by one physical mean or one functional mean.

DESCRIPTION OF EXEMPLARY EMBODIMENTS

Figure 1:
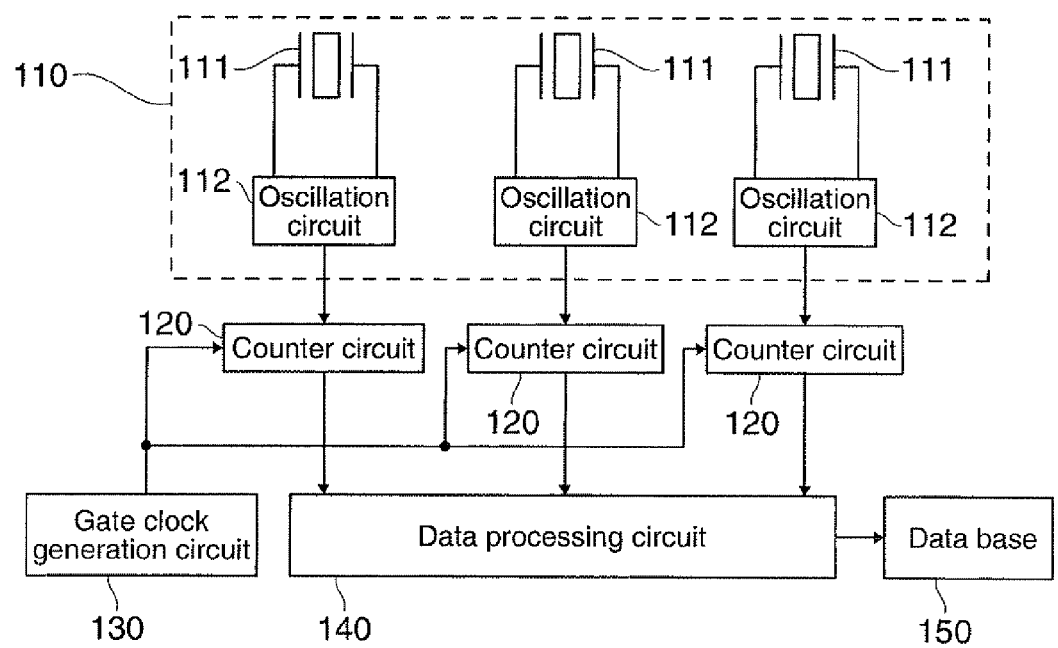
FIG. 1 is a diagram showing an example of a sensor system that includes an oscillator circuit array.

Embodiments of the invention will be described, according to the following composition, with reference to the accompanying drawings. It should be understood, however, that the following embodiments are merely examples of the invention, and do not limit the technical range of the invention. It is noted that identical parts in the drawings will be appended with the same reference numbers.

1. Example of Structure of Sensor System including Oscillator Circuit Array
2. Example of Structure of Oscillation Circuit Array
3. Example of Arrangement of Terminals of Oscillation circuits in an Oscillation Circuit Array
   (1) Embodiment 1
   (2) Embodiment 2
   (3) Embodiment 3
   (4) Embodiment 4
   (5) Layout Method
4. Composition Example of Oscillation Circuit Array including Oscillators
   (1) Oscillation Circuit Array including Crystal Oscillators with Leads
   (2) Oscillation Circuit Array 1 including Plane Mounting Type Crystal Oscillators
   (3) Oscillation Circuit Array 2 including Plane Mounting Type Crystal Oscillators
5. Conclusion

1. EXAMPLE OF STRUCTURE OF SENSOR SYSTEM INCLUDING OSCILLATOR CIRCUIT ARRAY

The invention relates to oscillator circuit arrays, and an oscillator circuit array in accordance with the invention may be used as parts of sensor systems or the like included in electronic apparatuses. The sensor systems can be used in a variety of apparatuses, such as, odor sensors, alcohol sensors and the like. The structure of a sensor system will be described below.

FIG. 1 is a diagram showing an example of a sensor system that includes an oscillator circuit array in accordance with an embodiment of the invention.

Outline of Structure of Sensor System

As shown in FIG. 1, the sensor system in accordance with the present embodiment includes an oscillator circuit array 110 equipped with plural sets of crystal vibrator 111 and oscillation circuit 112, a counter circuit 120, a gate clock generation circuit 130, a data processing circuit 140 and a database 150.

Crystal Oscillators 111

Each of the crystal oscillators 111 is a part of the oscillation circuit 112 and has a pair of electrodes formed on a front surface and a back surface thereof, and is structured to be connected to the oscillation circuit 112 via the pair of electrodes. The crystal oscillator 111 operates in a so-called thickness shear vibration mode in which the front surface and the back surface move in opposite directions upon application of a voltage between the pair of electrodes. Its resonance frequency $f_0$ (MHz) in operation is in reverse proportion to the thickness of the crystal plate t (μm) at a portion where the electrode pair is formed, and is generally expressed by the following equation (1).

[Equation 1]

$$f_0 = 1670/t \quad (1)$$

Further, the relation between changes in the oscillation frequency Δf of the crystal oscillator 111 and the mass ΔM adsorbed thereon is expressed by the following Sauerbrey equation (2).

[Equation 2]

$$\Delta f = -\frac{2 \times f_0^2}{\sqrt{\rho \times \mu}} \times \frac{\Delta M}{A} \quad (2)$$

In the equation (2), $f_0$ is a resonant frequency of the crystal oscillator, ρ is the density of quartz, μ is the shear modulus of quartz, and A is an effective vibration area that is generally equal to the electrode area. It is understood from the equation (2) that the sensitivity, i.e., a change Δf in frequency per adsorbed mass ΔM can be increased by increasing the resonant frequency $f_0$ of the crystal oscillator.

Also, the electrodes of the crystal oscillator 111 are equipped on their surfaces with adsorption films having a characteristic that selectively adsorbs specific substance, and are exposed to an ambient gas (or liquid) that is a target for odor detection. The adsorption films of different kinds are used for each of the crystal oscillators 111. In FIG. 1, the crystal oscillators 111 are equipped with mutually different kinds of adsorption films. The adsorption film may be formed on one or each of the surfaces of the crystal oscillator 111, but may preferably be formed on the both surfaces of the crystal oscillators 111. By forming the adsorption films on the both surfaces, target substance to be adsorbed can be more effectively adsorbed, compared to forming the adsorption film on one surface.

As the adsorption film, a polymer film, a fat film, a protein film, or a single molecule film may be used.

Oscillation Circuit 112

The oscillation circuit 112 is structured to include a crystal oscillator 111 that is connected through a terminal pair (an electrode pair) made of an input side terminal (input side electrode) and an output side terminal (output side electrode). The oscillation circuit 112 is a circuit that outputs an oscillation signal having a frequency defined by Equation 1 described above. A concrete structure of the oscillation circuit 112 will be described later.

Counter Circuit 120

The counter circuit 120 specifies a relation between the oscillation signal inputted from the oscillation circuit 112 and a gate clock inputted from the gate clock generation circuit 130, and outputs the specified result as a count value to the data processing circuit 140. More concretely, the counter circuit 120 counts pulses that are specified by rising edges or falling edges of the oscillation signal in each cycle of the gate clock (hereafter referred to as a gate time).

Gate Clock Generation Circuit 130

The gate clock generation circuit 130 is structured to supply the gate clock to the counter circuit 120. More specifically, the gate clock generation circuit 130 has a function to generate a gate clock having a predetermined frequency, and transmits the signal to each of the counter circuits 120. The gate clock is a signal that has a frequency lower than that of the oscillation signal. In other words, the signal cycle of the gate clock is longer than that of the oscillation signal. Specifically, it is empirically known that the signal cycle of the gate clock may preferably be 0.01 μsec. or greater but less than 1 sec.

Data Processing Circuit 140

The data processing circuit 140 is structured to specify, based on the count values outputted from the plurality of counter circuits 120, as to whether or not the respective crystal oscillators 111 adsorb their respective target substance, and/or the amount of target substance adsorbed. More specifically, based on the count value outputted from each of the counter circuits 120, the data processing circuit 140 specifies a frequency of the oscillation signal generated by the corresponding crystal vibrator 111 and the oscillation circuit 112. Further, the data processing circuit 140 observes a change in the frequency of the oscillation signal with time. Then, the data processing circuit 140, based on the change in the frequency of the oscillation signal, can specify as to whether or not each of the crystal oscillators 111 adsorbs substance, and as to the quantity of the substance if adsorbed, with reference to the database 150.

Database 150

The database 150 stores information necessary for specifying odors, and is structured to transmit the information in response to a request from the data processing circuit 140. Here, the information necessary for specifying odors may be, for example, a table showing relationships between frequency variations in the oscillation signal in each of the crystal oscillators 111 and the adsorption amounts of target substance to be adsorbed on each of the crystal oscillators 111.

Operation as Odor Sensor

The sensor system described above can be used, for example, as an odor sensor. An operation method in which the sensor system is used as an odor sensor will be described below.

First, the plurality of crystal oscillators 111 are oscillated in reference air (preferably odorless air treated with activated charcoal or the like), and the frequency of an oscillation signal outputted from each of the oscillation circuits 112 connected to the crystal oscillators 111, respectively, is measured.

Next, the plural crystal oscillators 111 are exposed to a gas that is a measurement target. If the gas can be smelled, the gas contains odor molecules that compose the odor, and the odor molecules are adsorbed to the adsorption films formed on the surface of the crystal oscillators 111. The odor molecules have a mass, and the crystal oscillators 111 having the adsorption films that have adsorbed the odor molecules have an increase in load corresponding to the mass of the odor molecules adsorbed. The increase in the load is observed as a reduction in the frequency of the oscillation frequency. In other words, the amount of the odor molecules adsorbed can be obtained by specifying the reduction in the frequency of the oscillation signal by the counter circuit 120 and the data processing circuit 140.

The database 150 stores relationships between changes in the frequency of the oscillation signal and adsorption quantities of odor molecules, and relationships between the adsorption quantities of odor molecules and odors, which have been formed in advance into a database. The data processing circuit 140 refers to the database 150, whereby, if matching data exists on the database 150, it is possible to specify that gas as an observation target has known odor.

2. EXAMPLE STRUCTURE OF OSCILLATION CIRCUIT

Figure 2:
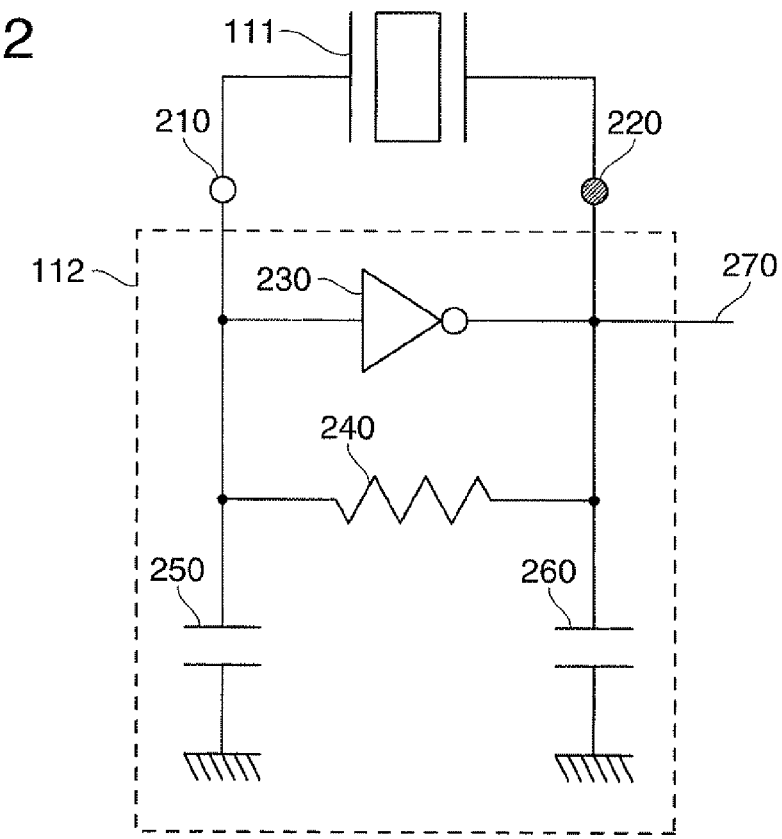
FIG. 2 is a diagram showing an example of the structure of an oscillation circuit.

FIG. 2 is a diagram showing an example of the structure of the oscillation circuit 112. As shown in FIG. 2, the oscillation circuit 112 includes an inverter 230, a feedback resistance 240, added capacitances 250 and 260, and an oscillation signal output terminal 270. The oscillation circuit 112 further includes a crystal oscillator 111 that is connected via a terminal pair made of an input side terminal 210 and an output side terminal 220. The oscillation circuit 112 including the crystal oscillator 111 forms a so-called Colpitts oscillation circuit. The input side terminal 210 is connected to a first electrode of the crystal oscillator 111, an input of the inverter 230, a first terminal of the feedback resistance 240 and a first terminal of the added capacitance 250. The output side terminal 220 is connected to a second electrode of the crystal oscillator 111, an output of the inverter 230, a second terminal of the feedback resistance 240, a first terminal of the added capacitance 260, and the oscillation signal output terminal 270. Also, a second terminal of the added capacitance 250 and a second terminal of the added capacitance 260 are both grounded. It is noted that the terminals of the crystal oscillators 111 and the feedback resistance 240 do not have polarities, such that their terminals may be inverted without affecting the operation at all.

The oscillation circuit 112 including the crystal oscillator 111 that is connected through a terminal pair made of the input side terminal 210 and output side terminal 220 has a property to amplify the signal on the input side terminal 210 and output the same from the output side terminal 220. For this reason, the voltage amplitude of the signal on the input side terminal 210 is relatively small, while the voltage amplitude of the signal on the output side terminal 220 is relatively large. Also, it is characterized in that the signal on the input side terminal 210 is close to a sine wave signal, while the signal on the output side terminal 220 is close to a square wave signal.

Due to the characteristics described above, as the signal on the input side terminal 210 is a sine wave having a small signal amplitude, it is difficult to become a generation source of EMI noise. However, if noise enters the signal on the input side terminal 210, the noise is amplified due to the property of the oscillation circuit 112 of amplifying signals, and outputted from the output side terminal 220. In other words, the input side terminal 210 would be difficult to become a noise generation source, but would likely be influenced by noise.

On the other hand, on the output side terminal 220, the voltage amplitude of the signal is large, and the signal is close to a square wave signal that contains many high frequency components. Therefore, the output side terminal 220 would likely become a noise generation source. However, the signal on the output side terminal 220 is greater in voltage amplitude than the signal on the input side terminal 210, and therefore has small influence by noise. Also, the signal on the output side terminal 220 does not have a characteristic to amplify noise, like the signal on the input side terminal 210. In other words, it can be said that the output side terminal 220 would likely become a noise generation source, but would be difficult to be affected by noise.

In view of the characteristics described above, in the oscillation circuit array that includes the plural oscillation circuits 112 in accordance with the present embodiment of the invention, it is understood that the terminals are desirous to be arranged in a manner that the input side terminals 210 and the output side terminals 220 included in the plural oscillation circuits 112 are not located close to one another in order to reduce the influence of crosstalk. Arrangements of the input side terminals and the output side terminals in the oscillation circuit array will be described in detail below.

It is noted that the Colpitts oscillation circuit is only an example, and the oscillation circuit 112 may be composed with any one of other structures.

3. ARRANGEMENT EXAMPLE OF TERMINALS OF OSCILLATION CIRCUITS IN OSCILLATION CIRCUIT ARRAY

The invention pertains to oscillation circuit arrays that may be used in the sensor system described above, and is substantially characterized by arrangements of the input side terminals (input side electrodes) and the output side terminals (output side electrodes). Arrangements of the terminals (electrodes) of the oscillation circuit array will be described below with reference to concrete embodiment examples.

(1) Embodiment Example 1

Figure 3:
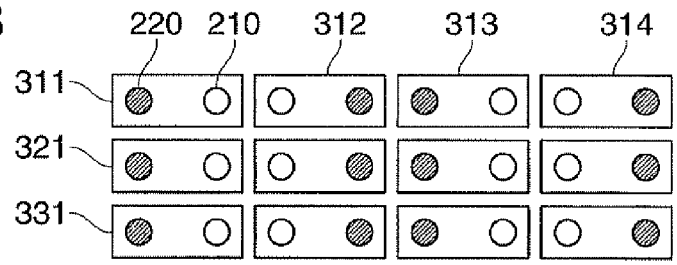
FIG. 3 is a view showing a first arrangement example of terminals in an oscillation circuit array.

FIG. 3 is a view showing a first arrangement example of terminals in an oscillation circuit array in accordance with an embodiment of the invention.

In FIG. 3, the oscillation circuit array includes rectangular shaped terminal arrangement regions, and the terminal arrangement regions 311, 312, 313, 314, 321 and 331 each include the input side terminal 210 and the output side terminal 220 shown in FIG. 2, and arranged in an array configuration as shown in FIG. 3. The input side terminal 210 and the output side terminal 220 are connected at areas adjacent to opposing ends of each of the terminal arrangement regions. In other words, the input side terminal 210 is disposed near a first end of the terminal arrangement region, and the output side terminal 220 is disposed near a second end of the terminal arrangement region on the opposite side of the first end. As shown in FIG. 3, the terminal arrangement regions 311, 312, 313 and 314 are arranged to extend on a linear line in a row direction, and a plurality of the terminal arrangement regions extending on linear lines in the row direction are arranged in plural rows in a column direction. In other words, the terminal arrangement regions are disposed in plurality in a manner to extend on linear lines in the row direction, starting from each of the terminal arrangement regions 311, 321 and 331 arranged in plurality in the column direction.

As for the input side terminals 210 and the output side terminals 220, the input side terminals 210 and the output side terminals 220 in the terminal arrangement regions that are arranged in the same column are arranged to have the same orientation, and an opposite orientation with respect to the input side terminals 210 and the output side terminals 220 in the terminal arrangement regions that are arranged in adjacent columns. Here, as for the terminals, on an extension line drawn on the input side terminal 210 and the output side terminal 220 in one of the terminal arrangement region 311, the input side terminals 210 and the output side terminals 220 in the other terminal arrangement regions 312, 313 and 314 are arranged. Also, in a direction perpendicular to the extension line of the input side terminal 210, the input side terminals 210 are arranged; and in a direction perpendicular to the extension line of the output side terminal 220, the output side terminals 220 are arranged. In other words, in the oscillation circuit array in accordance with the present embodiment example, on an extension line drawn on the input side terminal 210 and the output side terminal 220 in one of the oscillation circuits, the input side terminals 210 and the output side terminals 220 in other oscillation circuits are arranged. Further, in a direction perpendicular to the extension line of the input side terminal 210, the input side terminals 210 are arranged; and in a direction perpendicular to the extension line of the output side terminal 220, the output side terminals 220 are arranged.

The oscillation circuit in accordance with the present embodiment includes a first oscillation circuit 112 and a second oscillation circuit 112, wherein the first oscillation circuit 112 includes a first input side terminal 210 electrically connected to a first oscillator 111 and a first output side terminal 220 electrically connected to the first oscillator 111, and the second oscillation circuit 112 includes a second input side terminal 210 electrically connected to a second oscillator 111 and a second output side terminal 220 electrically connected to the second oscillator 111, wherein the distance between the first output side terminal 220 and the second input side terminal 210 is greater than the distance between the first input side terminal 210 and the first output side terminal 220.

According to the structure of the embodiment described above, the input side terminal 210 of one oscillation circuit 112 and the output side terminal 220 of another oscillation circuit 112 do not come closer to each other more than necessary. Therefore, the influence by crosstalk on the input side terminal 210 given by the output side terminal 220 can be made smaller.

Also, according to the structure described above, as the influence by crosstalk on the input side terminal 210 given by the output side terminal 220 can be made smaller, an interference preventive structure with respect to the output side terminal 220 and the input side terminal 210 can be reduced or eliminated. By this, size-reduction of the oscillation circuit array can be facilitated, and the cost can be reduced. This makes it also possible to achieve size-reduction and cost reduction of sensor systems having the oscillation circuit array mounted thereon.

The effects of the embodiment described above can be similarly achieved by embodiment examples 2 to 4 to be described below.

Also, in accordance with the present embodiment, the oscillation circuit array further includes a third oscillation circuit 112, wherein the third oscillation circuit 112 has a third input side terminal 210 electrically connected to a third oscillator 111 and a third output side terminal 220 electrically connected to the third oscillator 111. When a first direction is defined by a direction from the first input side terminal 210 to the first output side terminal 220, the first input side terminal 210, the first output side terminal 220, the second input side terminal 210 and the second output side terminal 220 may preferably be aligned in the first direction; the first input side terminal 210 and the third input side terminal 210 may preferably be aligned in a second direction traversing the first direction; and the first output side terminal 220 and the third output side terminal 220 may preferably be aligned in the second direction.

According to the structure of the embodiment example described above, the oscillation circuits can be effectively arranged in a small area, while making the best use of the advantages described above.

(2) Embodiment Example 2

Figure 4:
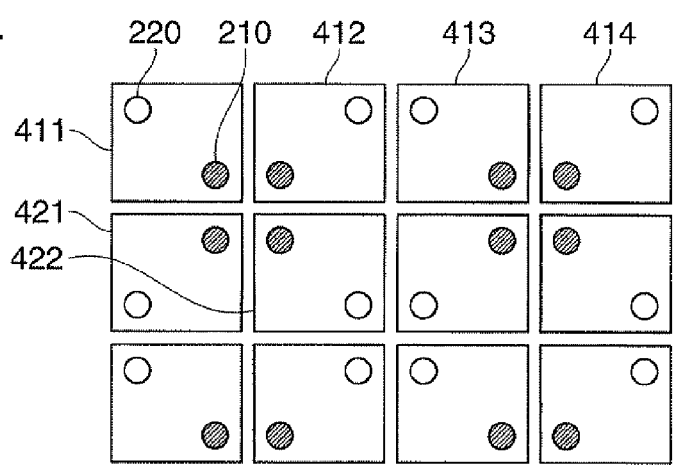
FIG. 4 is a view showing a second arrangement example of terminals in an oscillation circuit array.

FIG. 4 is a view showing a second arrangement example of terminals in an oscillation circuit array in accordance with an embodiment of the invention.

In FIG. 4, the oscillation circuit array includes square shaped terminal arrangement regions. The square shaped terminal arrangement regions 411, 412, 413, 414, 421 and 431 each include the input side terminal 210 and the output side terminal 220, and arranged in an array configuration as shown in FIG. 4. The input side terminal 210 and the output side terminal 220 are connected at areas adjacent to opposing ends of each of the terminal arrangement regions. In other words, the input side terminal 210 is disposed near a first end of the terminal arrangement region, and the output side terminal 220 is disposed near a second end of the terminal arrangement region on the opposite side of the first end. Furthermore, the terminal arrangement regions may preferably be disposed such that the first ends of adjacent ones of the terminal arrangement regions where the input side terminals 210 are disposed are gathered together. It is noted here that the expression "the first ends gather together" means that the first ends of other terminal arrangement regions are arranged adjacent to the first end of one terminal arrangement region. For example, in the embodiment example 2, four of the first ends are arranged in a manner to be gathered adjacent to one another, as shown in FIG. 4.

According to the structure of the embodiment example 2 described above, the input side terminals 210 are arranged so as to be gathered together, and the output side terminals 220 are not arranged adjacent to the input side terminals 210, such that the influence by crosstalk that the input side terminals 210 may receive from the output side terminals 220 can be further reduced.

Further, as shown in FIG. 4, the input side terminal 210 and the output side terminal 220 may preferably be connected at positions on a diagonal line of the terminal arrangement region.

According to the structure described above, the distance between the input side terminal 210 and the output side terminal 220 defines the longest distance in the terminal arrangement region, whereby the influence by noise between the input side terminal 210 and the output side terminal 220 disposed in the same oscillation circuit 112 can be made smaller. Also, an interference prevention structure that may be needed for the input side terminal 210 or the output side terminal 220 can be reduced, or eliminated.

It is noted that the second ends where the output side terminals 220 are disposed may not necessarily be arranged in a manner to be gathered together.

(3) Embodiment Example 3

Figure 5:
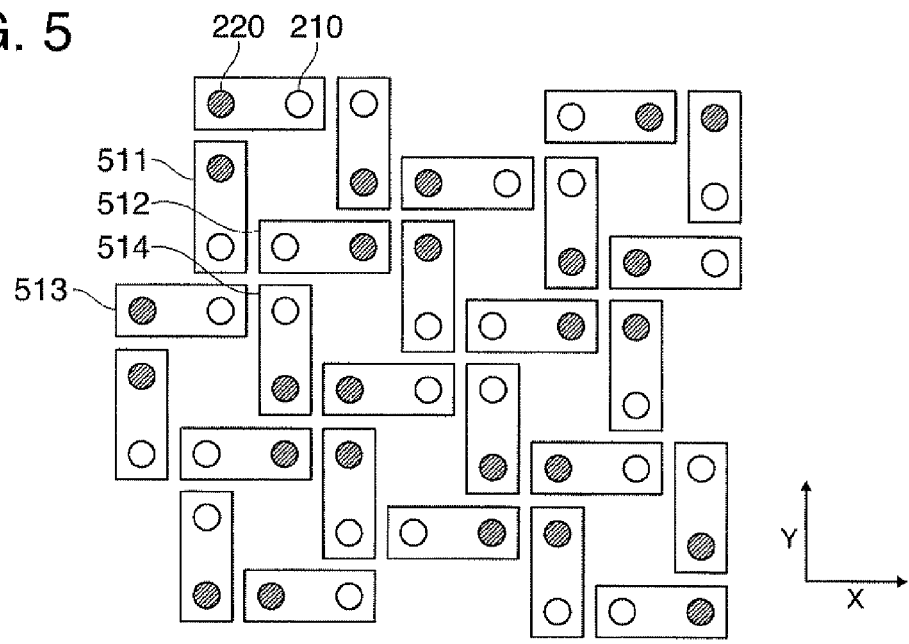
FIG. 5 is a view showing a third arrangement example of terminals in an oscillation circuit array.

FIG. 5 is a view showing a third arrangement example of terminals in an oscillation circuit array in accordance with an embodiment of the invention.

In FIG. 5, the oscillation circuit array includes rectangular shaped terminal arrangement regions. The rectangular shaped terminal arrangement regions 511, 512, 513 and 514 each include the input side terminal 210 and the output side terminal 220, and arranged in an array configuration as shown in FIG. 5. The input side terminal 210 and the output side terminal 220 are connected at areas adjacent to opposing ends of each of the terminal arrangement regions. In other words, the input side terminal 210 is disposed near a first end of the terminal arrangement region, and the output side terminal 220 is disposed near a second end of the terminal arrangement region on the opposite side of the first end. Furthermore, the terminal arrangement regions are disposed such that the first ends of mutually adjacent ones of the terminal arrangement regions where the input side terminals 210 are disposed are gathered together. Further, the terminal arrangement regions are also disposed such that the second ends of mutually adjacent ones of the terminal arrangement regions where the output side terminals 220 are disposed are gathered together.

According to the structure described above, the input side terminals are arranged in a manner to be gathered to one another, the influence of crosstalk that the input side terminals may receive from the output side terminals can be further reduced. Also, the terminal arrangement regions are disposed with suitable gaps from one another, such that the crystal oscillators 111 to be connected to the input side terminals 210 and the output side terminals 220 are also arranged with suitable gaps from one another. As a result, the fluidity of measurement target medium (including gas and liquid) to be in contact with the crystal oscillators 111 can be increased, and therefore the sensitivity of the sensor that includes the oscillation circuit array of the embodiment example can be made higher.

It is noted that the second ends where the output side terminals 220 are disposed may not necessarily be arranged in a manner to be gathered together.

(4) Embodiment Example 4

Figure 6:
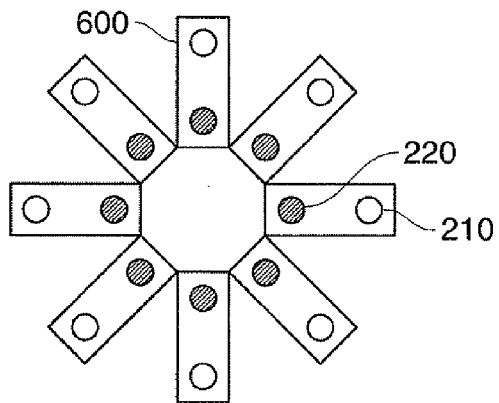
FIG. 6 is a view showing a fourth arrangement example of terminals in an oscillation circuit array.
Figure 7:
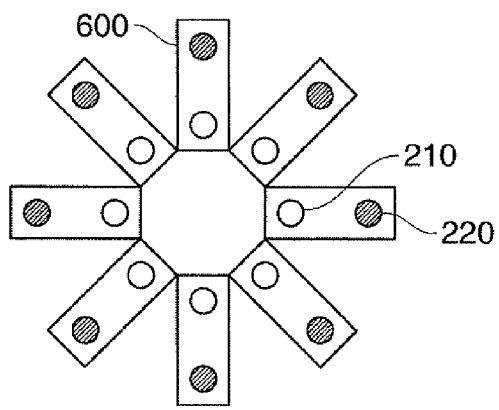
FIG. 7 is a view showing a fifth arrangement example of terminals in an oscillation circuit array.

FIG. 6 is a view showing a fourth arrangement example of terminals in an oscillation circuit array in accordance with an embodiment of the invention. FIG. 7 is a view showing a fifth arrangement example of terminals in an oscillation circuit array in accordance with an embodiment of the invention.

In FIG. 6, the oscillation circuit array includes plural rectangular shaped terminal arrangement regions 600 each including the input side terminal 210 and the output side terminal 220, and terminal arrangement regions 600 are arranged in a manner shown in FIG. 6. More specifically, as shown in FIG. 6, the input side terminals 210 are arranged on a first circle, and the output side terminals 220 are arranged on a second circle that has a smaller radius than the first circle and is concentric with the first circle. In other words, the first circle and the second circle are concentric, the second circle is located within the first circle, the output side terminals 220 are arranged on the second circle, and the input side terminals 210 are arranged on the first circle.

In the arrangement in FIG. 7, as compared to FIG. 6, the input side terminals 210 and the output side terminals 220 are inverted in their arrangement positions. In the plural rectangular shaped terminal arrangement regions 600 shown in FIG. 7, the input side terminals 210 are arranged on a first circle, and the output side terminals 220 are arranged on a second circle that has a greater radius than the first circle and is concentric with the first circle. In other words, the first circle and the second circle are concentric, the first circle is located within the second circle, the output side terminals 220 are arranged on the second circle, and the input side terminals 210 are arranged on the first circle.

In other words, in FIG. 6 and FIG. 7, one of the input side terminals 210 and the output side terminals 220 in the oscillation circuits 112 are arranged on a first circle, and the other of the input side terminals 210 and the output side terminals 220 in the oscillation circuits 112 are arranged on a second circle that has a greater radius than the first circle and is concentric with the first circle.

According to the structure in accordance with the embodiment example 4, the oscillation circuits are arranged in a circular configuration such that the output side terminals 220 that are noise generation sources are disposed outside (or inside), such that the influence by noise that the input side terminals disposed on the inside (or outside) the circle may receive can be made smaller. Also, when the oscillation circuit array is used in a sensor, the crystal oscillators 111 connected to the oscillation circuits 112 are disposed at suitable gaps from one another. Accordingly, the crystal oscillators 111 would more readily contact measurement target medium (including gas and liquid), and therefore the sensitivity of the sensor can be made higher.

(5) Layout Method

A method of laying out the oscillation circuits in the oscillation circuit array described above in accordance with the embodiment examples 1 to 4 will be described.

Figure 8:
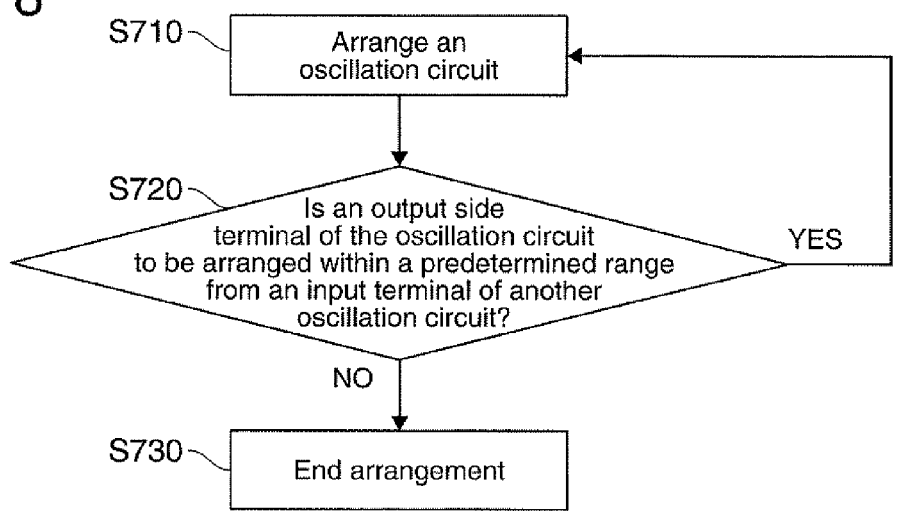
FIG. 8 is a flowchart showing a method of laying out oscillation circuits in an oscillation circuit array.

FIG. 8 is a flowchart showing a layout method for laying out oscillation circuits in an oscillation circuit array. As shown in FIG. 8, when the oscillation circuits 112 are arranged (S710), it is judged as to whether or not the output side terminal 220 of an oscillation circuit 112 to be arranged is within a predetermined range from the input side terminal 210 of another one of the oscillation circuits 112 (S720). When the output side terminal 220 of the oscillation circuit 112 to be arranged is within the predetermined range from the input side terminal 210 of another one of the oscillation circuits 112 (YES), placement of the output side terminal 220 in that range is prohibited, and the oscillation circuit 112 is placed again somewhere else (S710). When the output side terminal 220 of the oscillation circuit 112 to be arranged is not within the predetermined range from the input side terminal 210 of another one of the oscillation circuits 112 (NO), placement of the output side terminal 220 in that range is permitted, and placement of the oscillation circuit 112 is completed (S730).

In other words, with the oscillation circuits 112 laid out by the layout method described above, in a predetermined range from the input side terminal 210 in one of the oscillation circuits 112, placement of the output side terminal 220 in another of the oscillation circuits 112 is prohibited and placement of the input side terminal 210 is permitted.

According to the oscillation circuit array laid out in this manner, the influence of noise that the input side terminal 210 of an oscillation circuit 112 may receive from the output side terminal 220 can be suppressed.

Also, according to the layout method described above, the oscillation circuit array can be laid out in a manner to suppress the influence by noise the input side terminals 210 of the oscillation circuits 112 may receive from the output side terminals 220.

Also, the predetermined range from the input side terminal 210 in one of the oscillation circuits 112 may preferably be a radial range with a distance between the input side terminal 210 and the output side terminal 220 in that one oscillation circuit 112 being as a radius about the input side terminal 210 as a center.

The oscillation circuit 112 is in principle equipped with an input side terminal 210 and an output side terminal 220, and the input side terminal 210 is disposed at a distance which may not be readily affected by noise caused by crosstalk from the output side electrode 220 in the same oscillation circuit 112. Therefore, if the distance between the input side terminal 210 in one oscillation circuit 112 and the output side terminal 220 in another oscillation circuit 112 is longer than the distance between the input side terminal 210 and the output side terminal 220 in the one oscillation circuit 112, the influence of noise that the input side terminal 210 in the one oscillation circuit 112 may receive from the output side terminal 220 in the other oscillation circuit 112 may be relatively small. Further, by avoiding an excessive prohibition with respect to the location of disposing the output side terminal 220 in another oscillation circuit, an increase in the circuit size can be prevented.

4. COMPOSITION EXAMPLE OF OSCILLATION CIRCUIT ARRAY INCLUDING OSCILLATORS

Concrete examples of the oscillation circuits including the oscillators will be described below. The input side terminals 210 and the output side terminals 220 in the oscillation circuits 112 included in the oscillation circuit array to be described below are arranged like the examples described above in accordance with the embodiment examples 1 through 4.

(1) Oscillation Circuit Array Including Crystal Oscillators with Leads

Figure 9:
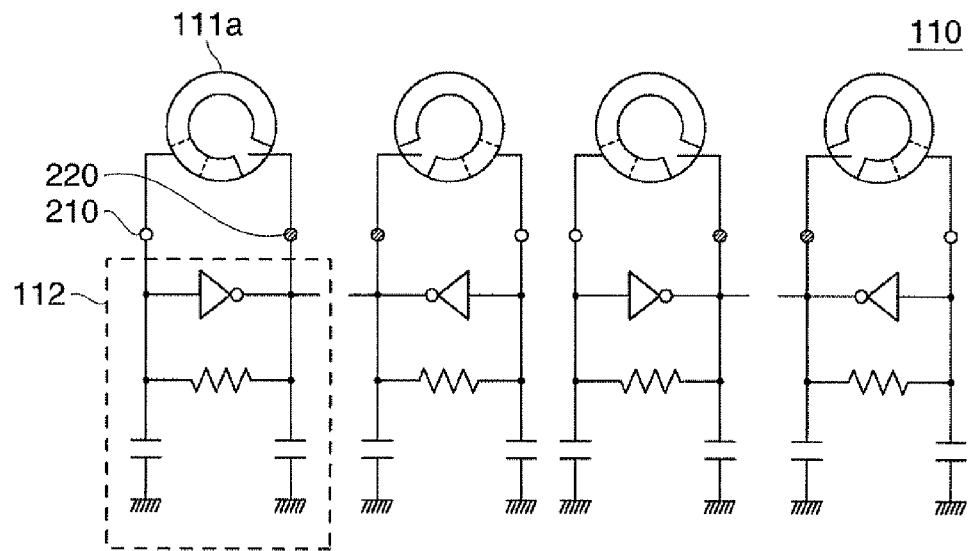
FIG. 9 is a diagram showing an example of the structure of an oscillation circuit array using crystal oscillators with leads.

FIG. 9 is a diagram showing an example of the structure of an oscillation circuit array using crystal oscillators with leads.

As shown in FIG. 9, each of the oscillation circuits 112 in the oscillation circuit array 110 includes a crystal oscillator with lead 111a, which is connected through a terminal pair made of an input side terminal 210 and an output side terminal 220. The crystal oscillator 111a is in a circular disc shape, and has the electrode pair formed on its front surface and back surface, respectively. Leads are connected to the electrode pair. The electrode pair is connected to the oscillation circuit 112 through the leads and the input side terminal 210 and the output side terminal 220.

Figure 10:
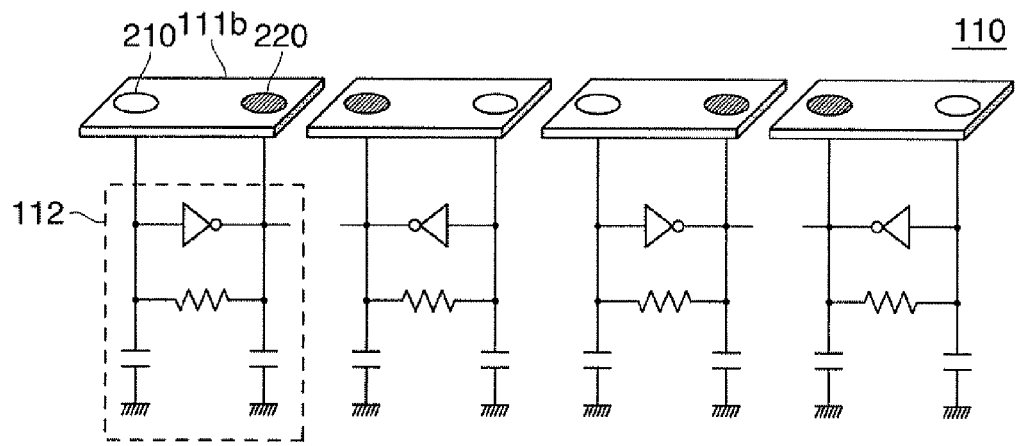
FIG. 10 is a view showing a first composition example of an oscillation circuit array using crystal oscillators in a plane mounting type.

(2) Oscillation Circuit Array 1 Including Plane Mounting Type Crystal Oscillators FIG. 10 is a view showing a first composition example of an oscillation circuit array using crystal oscillators in a plane mounting type.

As shown in FIG. 10, each the oscillation circuits 112 in the oscillation circuit array 110 is connected through a terminal pair made of an input side terminal 210 and an output side terminal 220, and includes a crystal oscillator 111b mounted on a rectangular shaped plane surface. The crystal oscillator 111b is a plate in a rectangular shape, and has a pair of electrodes formed on one or both of front surface and the back surface. The electrode pair is connected to the oscillation circuit 112 through the input side terminal 210 and the output side terminal 220. The input side terminal 210 is disposed near a first end of the mounting surface, and the output side terminal 220 is disposed near a second end of the mounting surface opposite to the first end.

Figure 11:
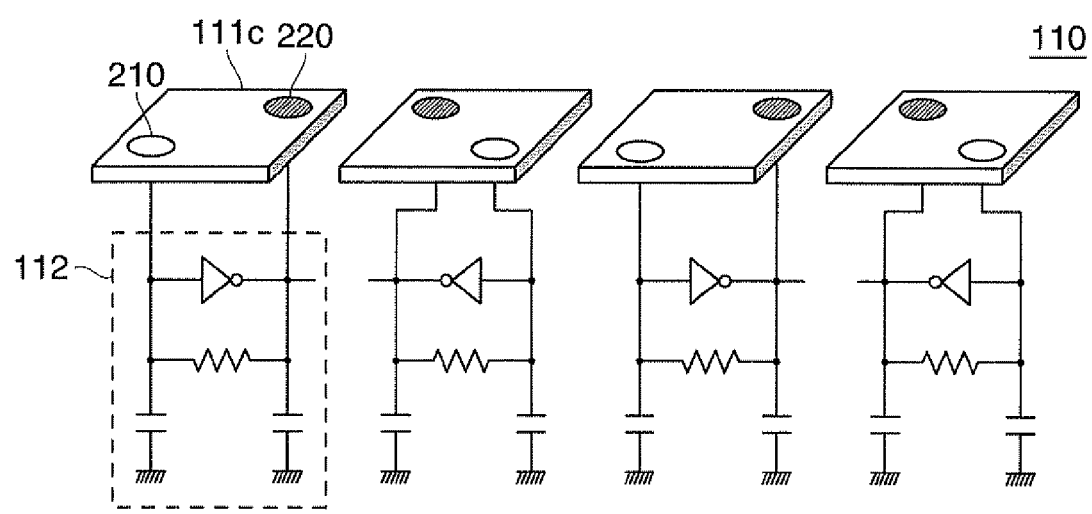
FIG. 11 is a view showing a second composition example of an oscillation circuit array using crystal oscillators in a plane mounting type.

(3) Oscillation Circuit Array 2 Including Plane Mounting Type Crystal Oscillators FIG. 11 is a view showing a second composition example of an oscillation circuit array using crystal oscillators in a plane mounting type.

By comparing FIG. 11 with FIG. 10, they are different in the shape of the plane on which the crystal oscillator is mounted and the arrangement of the input side terminal 210 and the output side terminal 220, but generally the same in other aspects. Therefore, only the aspects different from FIG. 10 will be described.

As shown in FIG. 11, the plane on which the crystal oscillator 111c is mounted is a rectangular shape including a square shape. The input side terminal 210 is disposed near a first end of the mounting surface, and the output side terminal 220 is disposed near a second end of the mounting surface opposite to the first end. Furthermore, the input side terminal 210 and the output side terminal 220 are connected at places located on a diagonal line of the mounting plane surface.

5. CONCLUSION

Some embodiments of the invention have been described above. The invention is applicable to a variety of electronic apparatuses using the oscillation circuit array described above. The electronic apparatus having such a structure is equipped with the characteristics of the oscillation circuit array in accordance with each of the embodiments of the invention, and therefore is capable of reducing, for example, the influence by crosstalk that the output side terminals may give to the input side terminals.

The invention is not limited to the embodiments described above, and various modifications can be made and applied. For example, instead of the crystal oscillators 111, other types of oscillators, such as, piezoelectric oscillators may be used.

Also, in accordance with the embodiments described above, the examples in which the input side terminals 210 and the output side terminals 220 are arranged on a plane surface have been described. However, the input side terminals 210 and the output side terminals 220 may be arranged in a three dimensional configuration, within the range of the invention described above.

Further, the terminal arrangement region does not necessarily need to be a rectangular shape, but may be in a circular shape, an oval shape or a polygonal shape.

INDUSTRIAL APPLICABILITY

The oscillator circuit array in accordance with the invention is applicable to, for example, sensor systems, and applicable to a wide range of equipments, such as, odor sensors, alcohol sensors, narcotic sensors and the like.

What is claimed is:

1. An oscillator circuit array comprising:
a first oscillation circuit in a plurality of oscillation circuits;
a first oscillator in a plurality of oscillators, the first oscillator connected to the first oscillation circuit;
a first terminal arrangement region in a plurality of terminal arrangement regions;
a second oscillation circuit in the plurality of oscillation circuits; and
a second oscillator in the plurality of oscillators, the second oscillator connected to the second oscillation circuit,
a second terminal arrangement region in the plurality of terminal arrangement regions, wherein
the first oscillation circuit includes a first input side terminal electrically connected to the first oscillator and a first output side terminal electrically connected to the first oscillator, the first input side terminal being disposed at a first end of the first terminal arrangement region, the first output side terminal being disposed at a second end of the first terminal arrangement region opposing the first end,
the second oscillation circuit includes a second input side terminal electrically connected to the second oscillator and a second output side terminal electrically connected to the second oscillator, the second input side terminal being disposed at a first end of the second terminal arrangement region, the second output side terminal being disposed at a second end of the second terminal arrangement region opposing the first end,
a first group of input side terminals of at least the first and the second oscillation circuit of the plurality of oscillation circuits are grouped together and arranged closer than a distance between any of the input side terminals and a respective output side terminal of the first or second oscillation circuit, and
a first group of output side terminals of at least the second oscillation circuit and a third oscillation circuit of the plurality of oscillation circuits are grouped together and arranged closer than a distance between any of the output side terminals and a respective input side terminal of the second or third oscillation circuit.

2. The oscillator circuit array according to claim 1, wherein the distance between the first output side terminal and the second input side terminal is greater than a distance between the second input side terminal and the second output side terminal, and
  wherein a distance between the first output side terminal and the second input side terminal is greater than a distance between the first input side terminal and the first output side terminal.

3. The oscillator circuit array according to claim 1, wherein
  the third oscillation circuit has a third input side terminal electrically connected to a third oscillator and a third output side terminal electrically connected to the third oscillator, wherein a first direction is defined by a direction from the first input side terminal to the first output side terminal, the first input side terminal, the first output side terminal, the second input side terminal and the second output side terminal are aligned in the first direction;
  the first input side terminal and the third input side terminal are aligned in a second direction traversing the first direction; and
  the first output side terminal and the third output side terminal are aligned in the second direction.

4. The oscillator circuit array according to claim 1, wherein the first terminal arrangement region and the second terminal arrangement region are disposed such that the first end of the first terminal arrangement region and the first end of the second terminal arrangement region are gathered.

5. The oscillator circuit array according to claim 4, wherein each of the first terminal arrangement region and the second terminal arrangement region has a rectangular shape, the first input side terminal and the first output side terminal are arranged to be located on a diagonal line of the first terminal arrangement region, and the second input side terminal and the second output side terminal are arranged to be located on a diagonal line of the second terminal arrangement region.

6. An oscillation circuit group comprising:
  a plurality of oscillation circuits, wherein each of the oscillation circuits includes
  an input side terminal and an output side terminal together defining a terminal pair;
  a terminal arrangement region including the terminal pair, the input side terminal being disposed at a first end of the terminal arrangement region, the output side terminal being disposed at a second end of the terminal arrangement region opposing the first end; and
  an oscillator connected to the terminal pairs, wherein
  a first group of input side terminals of at least a first and a second oscillation circuit of the plurality of oscillation circuits are grouped together and arranged closer than a distance between any of the input side terminals and a respective output side terminal of the first or second oscillation circuit, and
  a first group of output side terminals of at least the second oscillation circuit and a third oscillation circuit of the plurality of oscillation circuits are grouped together and arranged closer than a distance between any of the output side terminals and a respective input side terminal of the second or third oscillation circuit.

7. The oscillation circuit group according to claim 6, wherein the predetermined range is a range of a distance between the input side terminal and the output side terminal in each of the oscillation circuits.

8. An electronic apparatus comprising the oscillation circuit recited in claim 1.

9. A layout method for laying out an oscillation circuit group including a plurality of oscillation circuits, wherein each of the oscillation circuits includes an input side terminal and an output side terminal together defining a terminal pair, a terminal arrangement region including the terminal pair, the input side terminal being disposed at a first end of the terminal arrangement region, the output side terminal being disposed at a second end of the terminal arrangement region opposing the first end, and an oscillator connected to the terminal pairs, the method comprising:
  laying out the oscillation circuit group such that placement of the output side terminal in one of the oscillation circuits is prohibited in a predetermined range from the input side terminal of another of the oscillation circuits, and placement of the input side terminal is permitted in a predetermined range from the input side terminal of another of the oscillation circuits, wherein
  a first group of input side terminals of at least a first and a second oscillation circuit of the plurality of oscillation circuits are grouped together and arranged closer than a distance between any of the input side terminals and a respective output side terminal of the first or second oscillation circuit, and
  a first group of output side terminals of at least the second oscillation circuit and a third oscillation circuit of the plurality of oscillation circuits are grouped together and arranged closer than a distance between any of the output side terminals and a respective input side terminal of the second or third oscillation circuit.

10. An electronic apparatus comprising the oscillation circuit group recited in claim 6.

11. The oscillator circuit array according to claim 1, wherein the first input side terminal, the first output side terminal, the second input side terminal and the second output side terminal are all disposed along a single line.

12. The oscillation circuit according to claim 1, wherein a signal through the input side terminal is amplified and outputted from the output side terminal.

13. The oscillator circuit array according to claim 1, wherein a signal through the input side terminal is in the form of a sine wave signal, and a signal through the output side terminal is in the form of a square wave signal.

14. The oscillator circuit array according to claim 1, wherein the arrangement of one or more oscillation circuits are disposed on a plane surface or a curved surface or a globular surface.

15. The oscillation circuit according to claim 6, wherein a signal through the input side terminal is amplified and outputted from the output side terminal.

16. The oscillation circuit group according to claim 6, wherein a signal through the input side terminal is in the form of a sine wave signal, and a signal through the output side terminal is in the form of a square wave signal.

17. The oscillation circuit group according to claim 6, wherein the arrangement of one or more oscillation circuits is disposed on a plane surface or a curved surface or a globular surface.

18. An oscillator circuit array comprising:
  a first oscillation circuit;
  a first oscillator connected to the first oscillation circuit;
  a first terminal arrangement region;
  a second oscillation circuit;
  a second oscillator connected to the second oscillation circuit;
  a second terminal arrangement region; wherein
  the first oscillation circuit includes a first input side terminal electrically connected to the first oscillator and a first output side terminal electrically connected to the first oscillator, the first input side terminal being disposed at a first end of the first terminal arrangement region, the first output side terminal being disposed at a second end of the first terminal arrangement region opposing the first end, the second oscillation circuit includes a second input side terminal electrically connected to the second oscillator and a second output side terminal electrically connected to the second oscillator, the second input side terminal being disposed at a first end of the second terminal arrangement region, the second output side terminal being disposed at a second end of the second terminal arrangement region opposing the first end, a plurality of terminal arrangement regions are arranged to extend on a linear line in a row direction, and a plurality of terminal arrangement regions extending in linear lines in the row direction are arranged in plural rows in the column direction, the row direction being perpendicular to the column direction, at least two terminal arrangement regions in the plurality of terminal arrangement regions extending in the row direction are arranged such that one end corresponding to an input side terminal of a given terminal arrangement region of the at least two terminal arrangement regions, is adjacent to another end corresponding to an input side terminal of the other terminal arrangement region of the at least two terminal arrangement regions, and at least two terminal arrangement regions in the plurality of terminal arrangement regions extending in the column direction are arranged such that one end corresponding to an input side terminal of a given terminal arrangement region of the at least two terminal arrangement regions, is adjacent to another end corresponding to an input side terminal of the other terminal arrangement region of the at least two terminal arrangement regions.

* * * * *